US012558893B2

(12) United States Patent
Miwa

(10) Patent No.: US 12,558,893 B2
(45) Date of Patent: Feb. 24, 2026

(54) PIEZOELECTRIC ACTUATOR, LIQUID DISCHARGE HEAD, AND LIQUID DISCHARGE APPARATUS

(71) Applicant: Keishi Miwa, Kanagawa (JP)

(72) Inventor: Keishi Miwa, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 107 days.

(21) Appl. No.: 18/605,948

(22) Filed: Mar. 15, 2024

(65) Prior Publication Data

US 2024/0316928 A1 Sep. 26, 2024

(30) Foreign Application Priority Data

Mar. 24, 2023 (JP) ................................. 2023-047666

(51) Int. Cl.
*B41J 2/14* (2006.01)
*H10N 30/20* (2023.01)
*H10N 30/87* (2023.01)

(52) U.S. Cl.
CPC ...... *B41J 2/14233* (2013.01); *H10N 30/2047* (2023.02); *H10N 30/87* (2023.02); *H10N 30/877* (2023.02); *B41J 2002/14258* (2013.01)

(58) Field of Classification Search
CPC .......... B41J 2002/14491; B41J 2/14201; B41J 2/14233
See application file for complete search history.

(56) References Cited

U.S. PATENT DOCUMENTS

| | | | | |
|---|---|---|---|---|
| 6,336,717 | B1 * | 1/2002 | Shimada | ................ B41J 2/1646 347/71 |
| 2006/0082617 | A1 * | 4/2006 | Nagashima | .......... B41J 2/04573 347/68 |
| 2010/0201755 | A1 * | 8/2010 | Mita | .................... B41J 2/14233 347/71 |
| 2015/0171307 | A1 | 6/2015 | Masuda et al. | |
| 2016/0001556 | A1 | 1/2016 | Masuda et al. | |
| 2017/0100934 | A1 | 4/2017 | Masuda et al. | |
| 2019/0275796 | A1 | 9/2019 | Miwa | |
| 2020/0298569 | A1 | 9/2020 | Miwa | |

(Continued)

FOREIGN PATENT DOCUMENTS

| | | |
|---|---|---|
| JP | 2000-025225 A | 1/2000 |
| JP | 2017-191859 A | 10/2017 |
| JP | 2020-107624 A | 7/2020 |

*Primary Examiner* — Scott A Richmond
(74) *Attorney, Agent, or Firm* — XSENSUS LLP

(57) ABSTRACT

A piezoelectric actuator includes: a substrate having an opening; a diaphragm: having a first face on one face of the substrate; and facing the opening; and a piezoelectric element including: a lower electrode; a piezoelectric body; and an upper electrode, and the lower electrode, the piezoelectric body, and the upper electrode being sequentially laminated on a second face opposite to the first face of the diaphragm in a lamination direction, wherein the lower electrode includes: a first lower electrode extending in a first direction; and multiple second lower electrodes: each extending in the first direction; on each of both sides of the first lower electrode in a second direction orthogonal to the first direction; and separated from the first lower electrode in the second direction, and the piezoelectric body is interior of both ends of the opening in the second direction.

12 Claims, 10 Drawing Sheets

1

OPENING ARRAY DIRECTION

(56) References Cited

U.S. PATENT DOCUMENTS

| | | | |
|---|---|---|---|
| 2020/0298570 | A1 | 9/2020 | Masuda et al. |
| 2021/0016568 | A1 | 1/2021 | Miwa |
| 2021/0036208 | A1 | 2/2021 | Shimofuku et al. |
| 2021/0162759 | A1 | 6/2021 | Miwa et al. |
| 2021/0370675 | A1 | 12/2021 | Yoshita et al. |
| 2023/0049164 | A1 | 2/2023 | Toyota et al. |
| 2023/0106664 | A1 | 4/2023 | Miwa |
| 2023/0130058 | A1 | 4/2023 | Miwa |
| 2023/0139963 | A1 | 5/2023 | Miwa |
| 2023/0249461 | A1 | 8/2023 | Matsuda et al. |
| 2023/0294403 | A1 | 9/2023 | Nagahashi et al. |
| 2023/0330990 | A1 | 10/2023 | Fujimura et al. |

* cited by examiner

OPENING ARRAY DIRECTION

OPENING ARRAY DIRECTION

OPENING ARRAY DIRECTION

OPENING ARRAY DIRECTION

FIG. 7    COMPARATIVE EXAMPLE
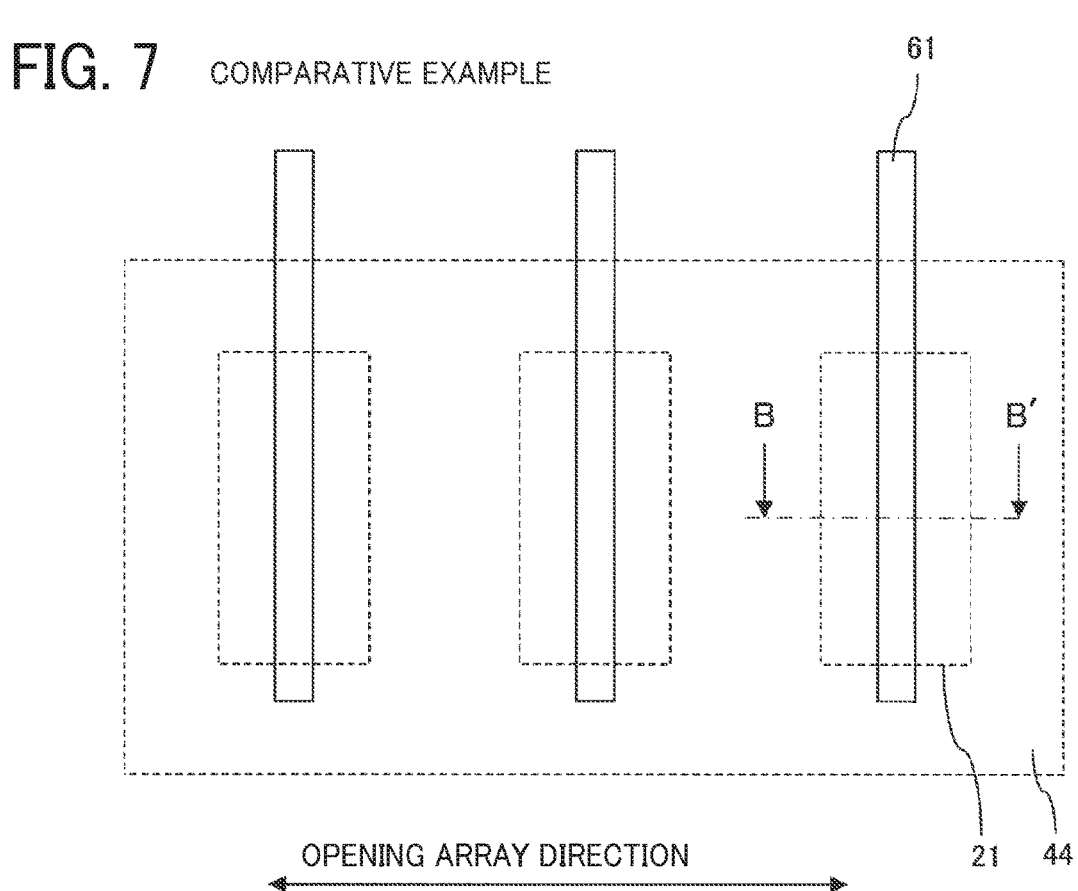
OPENING ARRAY DIRECTION
FIG. 8    COMPARATIVE EXAMPLE
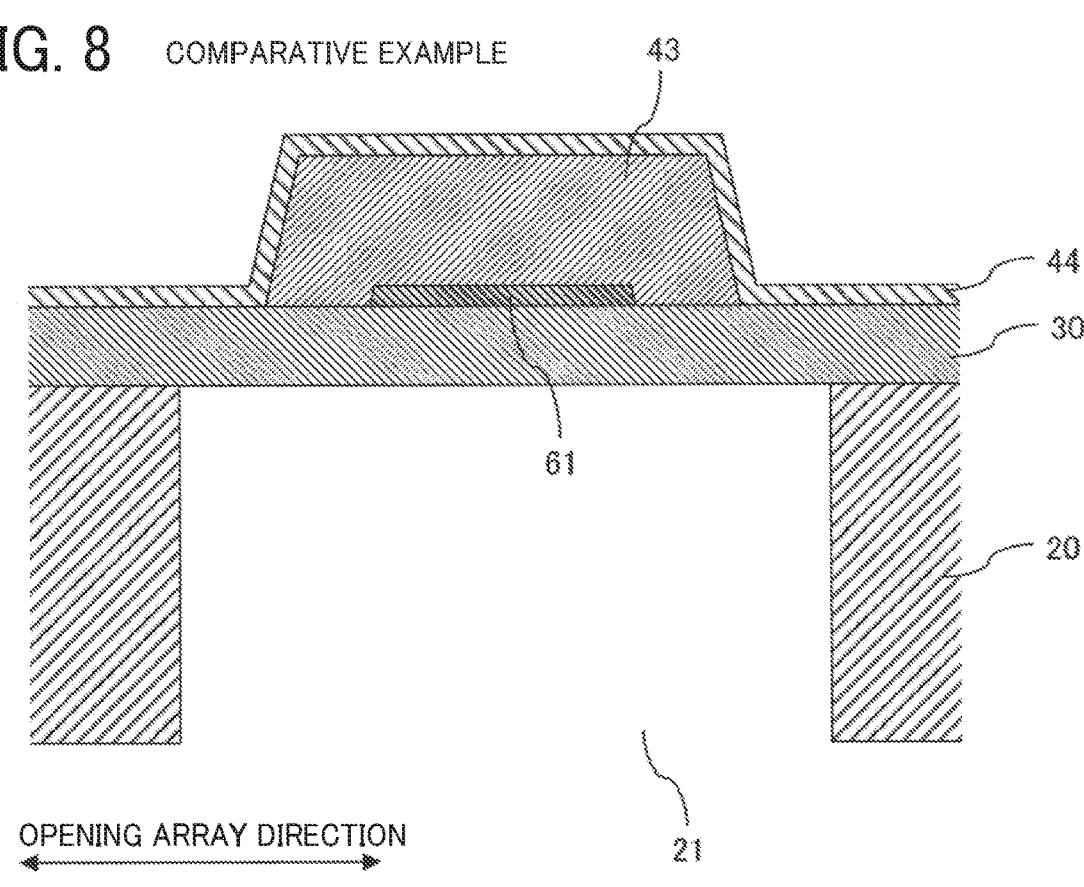
OPENING ARRAY DIRECTION

OPENING ARRAY DIRECTION

OPENING ARRAY DIRECTION

OPENING ARRAY DIRECTION

OPENING ARRAY DIRECTION

OPENING ARRAY DIRECTION

NOZZLE ARRAY DIRECTION

PIEZOELECTRIC ACTUATOR, LIQUID DISCHARGE HEAD, AND LIQUID DISCHARGE APPARATUS

CROSS-REFERENCE TO RELATED APPLICATIONS

This patent application is based on and claims priority pursuant to 35 U.S.C. § 119(a) to Japanese Patent Application No. 2023-047666, filed on Mar. 24, 2023, in the Japan Patent Office, the entire disclosure of which is hereby incorporated by reference herein.

BACKGROUND

Technical Field

Embodiments of this disclosure relate to a piezoelectric actuator, a liquid discharge head, and a liquid discharge apparatus

Related Art

A liquid discharge head uses a piezoelectric actuator using a piezoelectric element to discharge liquid inside a pressure chamber from a nozzle. The piezoelectric element includes, for example, a lower electrode, a piezoelectric body, and an upper electrode that are laminated.

In the liquid discharge head, a piezoelectric layer includes a first area that is positioned between a first electrode (an upper electrode) and a second electrode (a lower electrode), and a second area that does not overlap at least one of the first electrode and the second electrode when viewed in plan. A film thickness of the second area is greater than a film thickness of the first area. An area near the boundary between the first area and the second area can be prevented from being damaged even if the liquid discharge head is used for a long term.

SUMMARY

An aspect of the present disclosure, a piezoelectric actuator includes: a substrate having an opening; a diaphragm: having a first face on one face of the substrate; and facing the opening; and a piezoelectric element including: a lower electrode; a piezoelectric body; and an upper electrode, and the lower electrode, the piezoelectric body, and the upper electrode being sequentially laminated on a second face opposite to the first face of the diaphragm in a lamination direction, wherein the lower electrode includes: a first lower electrode extending in a first direction; and multiple second lower electrodes: each extending in the first direction; on each of both sides of the first lower electrode in a second direction orthogonal to the first direction; and separated from the first lower electrode in the second direction, the piezoelectric body is interior of both ends of the opening in the second direction, and the first lower electrode is interior of both ends of the piezoelectric body in the second direction.

BRIEF DESCRIPTION OF THE DRAWINGS

A more complete appreciation of embodiments of the present disclosure and many of the attendant advantages and features thereof can be readily obtained and understood from the following detailed description with reference to the accompanying drawings, wherein:

FIG. 7 is a plan view illustrating a piezoelectric actuator according to a comparative example;

FIG. 8 is a sectional view illustrating the piezoelectric actuator according to the comparative example;

FIG. 9 is a sectional view schematically illustrating a crystal state of a piezoelectric body illustrated in FIG. 8;

FIG. 10 is a plan view illustrating another example of the piezoelectric actuator according to the embodiment;

Figure 1:
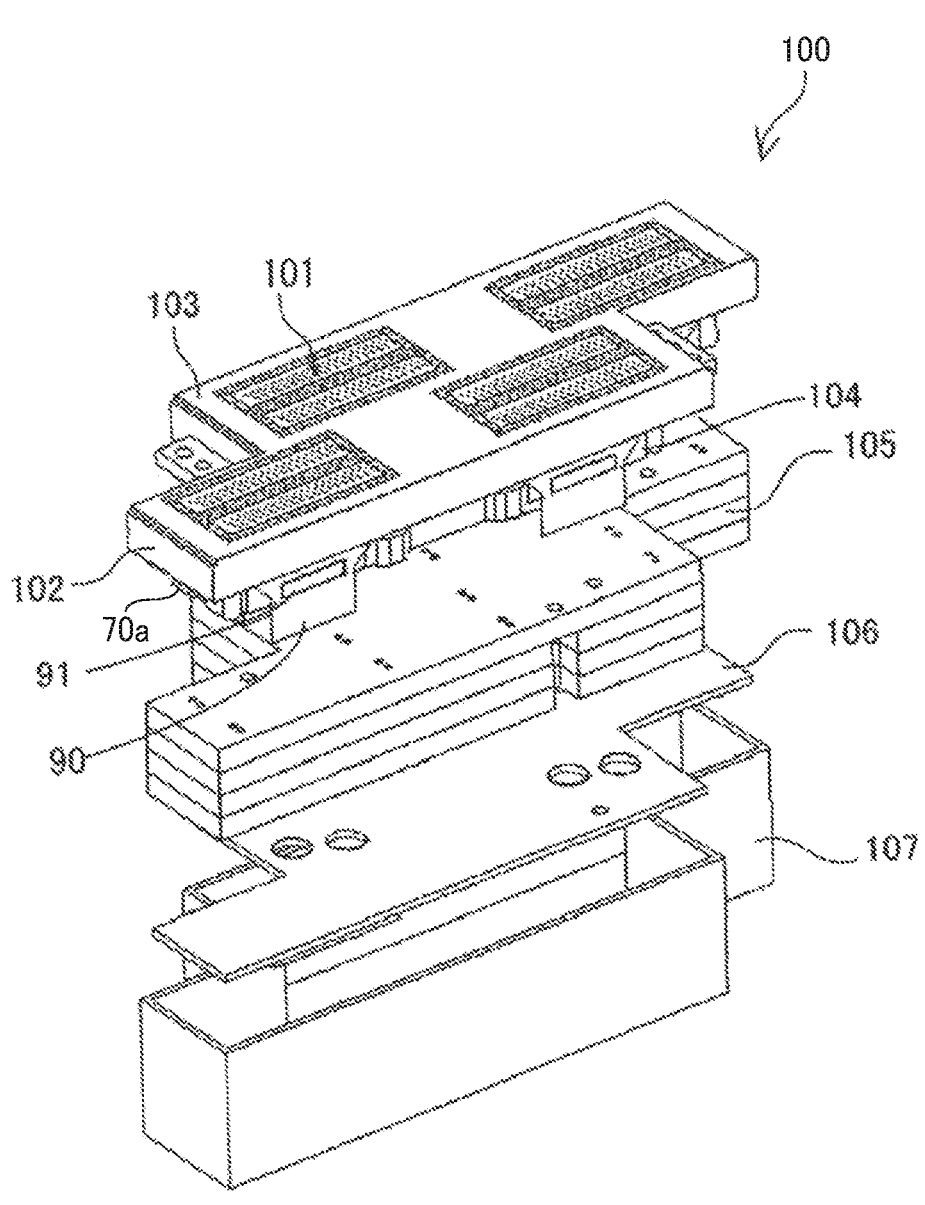
FIG. 1 is an exploded perspective view schematically illustrating one example of a head module according to an embodiment.

The accompanying drawings are intended to depict embodiments of the present disclosure and should not be interpreted to limit the scope thereof. The accompanying drawings are not to be considered as drawn to scale unless explicitly noted. Also, identical or similar reference numerals designate identical or similar components throughout the several views.

DETAILED DESCRIPTION

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Referring now to the drawings, embodiments of the present disclosure are described below. As used herein, the singular forms "a," "an," and "the" are intended to include the plural forms as well, unless the context clearly indicates otherwise.

Hereinafter, a piezoelectric actuator, a liquid discharge head, and a liquid discharge apparatus according to the preset disclosure are described with reference to the drawings. Note that the present disclosure is not limited to each embodiment described below. Other embodiments and modifications such as addition, change, and deletion can be made by those skilled in the art within the scope of the present disclosure. Any of the aspects can be included in the scope of the present disclosure as long as functions and effects of the present disclosure are provided A piezoelectric actuator of the present disclosure includes a substrate, a diaphragm, and a piezoelectric body. The substrate has an opening. The diaphragm is formed on one face of the substrate, and covers one region of the opening. The piezoelectric element is disposed on the diaphragm, and includes a lower electrode, a piezoelectric body, and an upper electrode that are sequentially laminated on a side opposite the substrate. The lower electrode includes a first lower electrode and a second lower electrode. In one direction in a planar direction of the substrate, the piezoelectric body is formed inside relative to both end portions of the opening in the one direction, and the first lower electrode is formed inside relative to both end portions of the piezoelectric body in the one direction. In the one direction, the second lower electrode is separated from the first lower electrode and is formed on each of both sides of the first lower electrode in the one direction.

A liquid discharge head of the present disclosure includes the piezoelectric actuator described above and a nozzle member. The nozzle member is bonded to the substrate on a side opposite the diaphragm of the substrate, and includes a nozzle corresponding the opening. Liquid retained in the opening is discharged from the nozzle.

A liquid discharge apparatus of the present disclosure includes the liquid discharge head described above, and a driver that drives the piezoelectric element of the piezoelectric actuator.

According to the present embodiment, a piezoelectric actuator that can reduce a failure in a piezoelectric body and has enhanced reliability can be provided. The present embodiment can be applied to, for example, a liquid discharge head, and a liquid discharge apparatus including the liquid discharge head. Effects of the present embodiment are not limited to the liquid discharge head. The effects can be provided even if the present embodiment is applied to, for example, an ultrasonic oscillator and an optical element (e.g., a micro electric mechanical system (MEMS) mirror). The piezoelectric actuator of the present embodiment can be used for, for example, an oscillation element of an ultrasonic diagnostic device, and an actuator for a MEMS mirror in addition to the actuator for the liquid discharge head.

First, a liquid discharge apparatus according to the present embodiment is described using an example. The liquid discharge apparatus of the present embodiment can be used as, for example, an image forming apparatus, a printing apparatus, a recording apparatus, an inkjet printer, and a head module. The liquid discharge apparatus can be referred to as an apparatus for discharging liquid.

Figure 2:
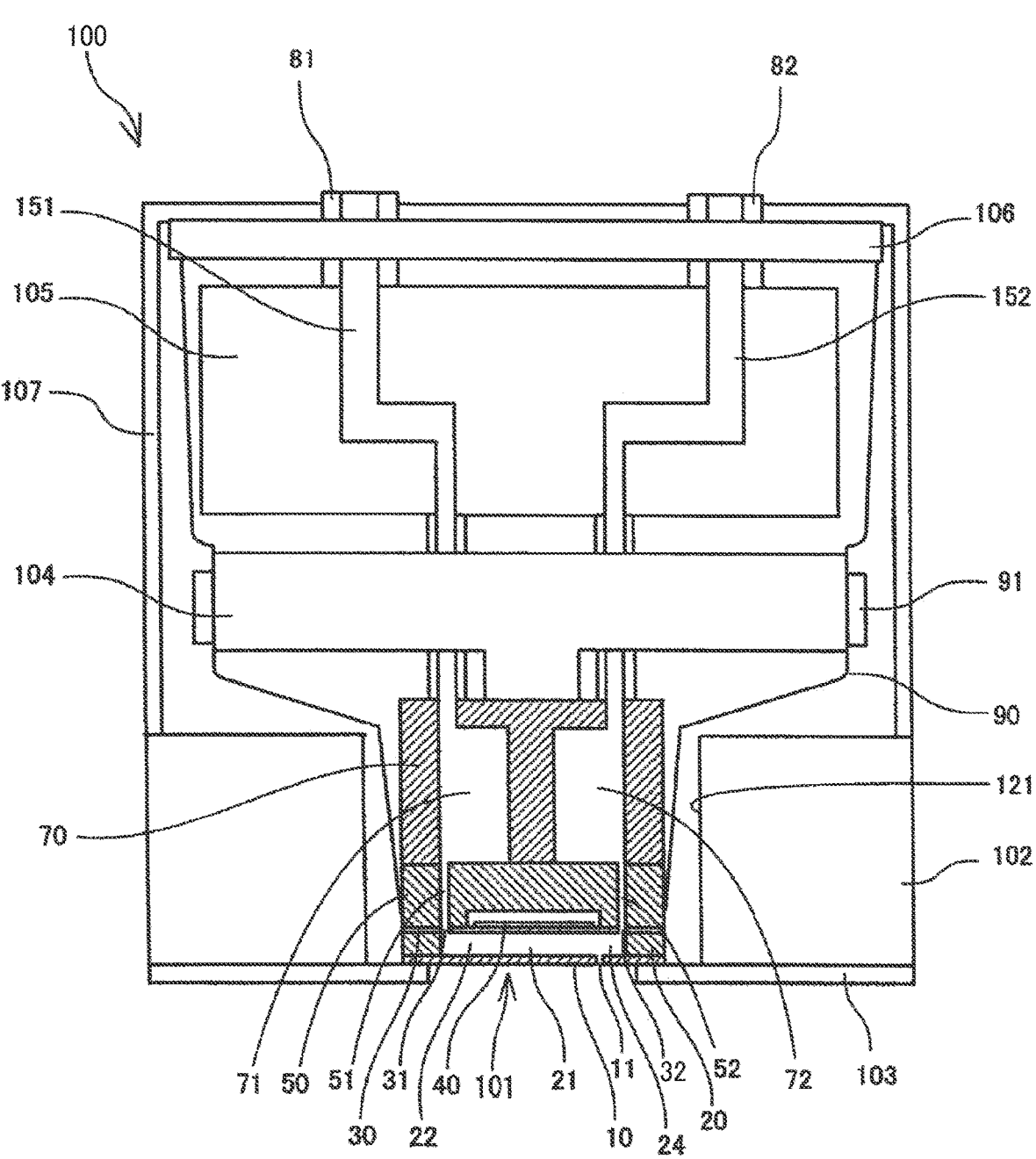
FIG. 2 is a sectional view illustrating one example of the head module according to the embodiment.

FIG. 1 is an exploded perspective view illustrating a head module 100 as one example of the liquid discharge apparatus according to the present embodiment, as seen from a nozzle face side. FIG. 2 is a sectional view illustrating the head module 100 along a head lateral direction that is a direction perpendicular to a nozzle array direction and perpendicular to an opening array direction.

The head module 100 includes multiple liquid discharge heads 101, a base member 102, a cover member 103, a heat releasing member 104, a manifold 105, a printed circuit board 106, and a module case 107.

The liquid discharge head 101 includes, for example, a nozzle plate 10, a channel substrate 20, a diaphragm 30, a piezoelectric element 40, a retaining substrate 50, and a frame member 70.

The nozzle plate 10 can be referred to as a nozzle member, and a nozzle 11 is formed on the nozzle plate 10.

The channel substrate 20 includes an opening 21 that communicates with the nozzle 11. The opening 21 is also referred to as a pressure liquid chamber, a pressure chamber, or a liquid chamber. If the term "substrate" is simply used, the substrate represents the channel substrate 20 unless otherwise noted.

With the opening 21 (a pressure liquid chamber), the channel substrate 20 forms a supply side individual channel 22 and a collection side individual channel 24. Each of the supply side individual channel 22 and the collection side individual channel 24 communicates with the opening 21.

The diaphragm 30 is formed on one face of the channel substrate 20 so as to cover one region of the opening 21. The diaphragm 30 is deformed by driving of the piezoelectric element 40, and the deformation of the diaphragm 30 changes a pressure inside the opening 21.

The retaining substrate 50 is stacked on the diaphragm 30. The retaining substrate 50 includes, for example, a supply-side intermediate individual channel 51 and a collection-side intermediate individual channel 52. The supply-side intermediate individual channel 51 communicates with the supply side individual channel 22 via an opening 31 of the diaphragm 30. The collection-side intermediate individual channel 52 communicates with collection side individual channel 24 via an opening 32 of the diaphragm 30.

The frame member 70 is stacked on the retaining substrate 50. The frame member 70 has a common channel, and is also referred to as a common channel member. The frame member 70 has, for example, a supply-side common channel 71 and a collection-side common channel 72.

The supply-side common channel 71 communicates with the supply-side intermediate individual channel 51. Moreover, the supply-side common channel 71 communicates with a supply port 81 via a channel 151 of the manifold 105. The collection-side common channel 72 communicates with the collection-side intermediate individual channel 52. Moreover, the collection-side common channel 72 communicates with a collection port 82 via a channel 152 of the manifold 105.

The printed circuit board 106 and the piezoelectric element 40 of the liquid discharge head 101 are connected via a flexible wiring member 90. On the flexible wiring member 90, a driver integrated circuit (IC) 91 (a drive circuit) is mounted.

In the present embodiment, the multiple liquid discharge heads 101 is spaced apart on the base member 102. For example, the liquid discharge heads 101 are attached on the base member 102 as follows. The liquid discharge head 101 is inserted into an opening 121 provided in the base member 102. Then, a rim portion of the nozzle plate 10 of the liquid discharge head 101 is securely bonded to the cover member 103 securely bonded to the base member 102. Moreover, a flange portion 70a that is externally arranged on the frame member 70 of the liquid discharge head 101 is securely bonded to the base member 102.

A method for securing the liquid discharge head 101 to the base member 102 is not particularly limited. The liquid discharge head 101 may be attached or swaged to the base member 102. Alternatively, the liquid discharge head 101 may be secured to the base member 102 by a screw.

The base member 102 is preferably made of a material having a low linear expansion coefficient. Examples of such a material can include alloy 42 that is addition of nickel to iron, and an invar material. In the present embodiment, the invar material is used. In this case, since an amount of expansion of the base member 102 is small, a nozzle does not tend to be displaced from a predetermined nozzle position even if a temperature of the base member 102 rises due to heat generated by the liquid discharge head 101. Thus, landing displacement can be prevented.

In the present embodiment, each of the nozzle plate 10, the channel substrate 20, and the diaphragm 30 is preferably formed of a silicon single crystal substrate. More preferably, each of the nozzle plate 10, the channel substrate 20, and the diaphragm 30 has a linear expansion coefficient that is the same as or substantially the same as a linear expansion coefficient of the base member 102. If a linear expansion coefficient of each of the nozzle plate 10, the channel substrate 20, and the diaphragm 30 is the same as or substantially the same as a linear expansion coefficient of the base member 102, nozzle displacement due to thermal expansion can be further reduced.

Figure 3:
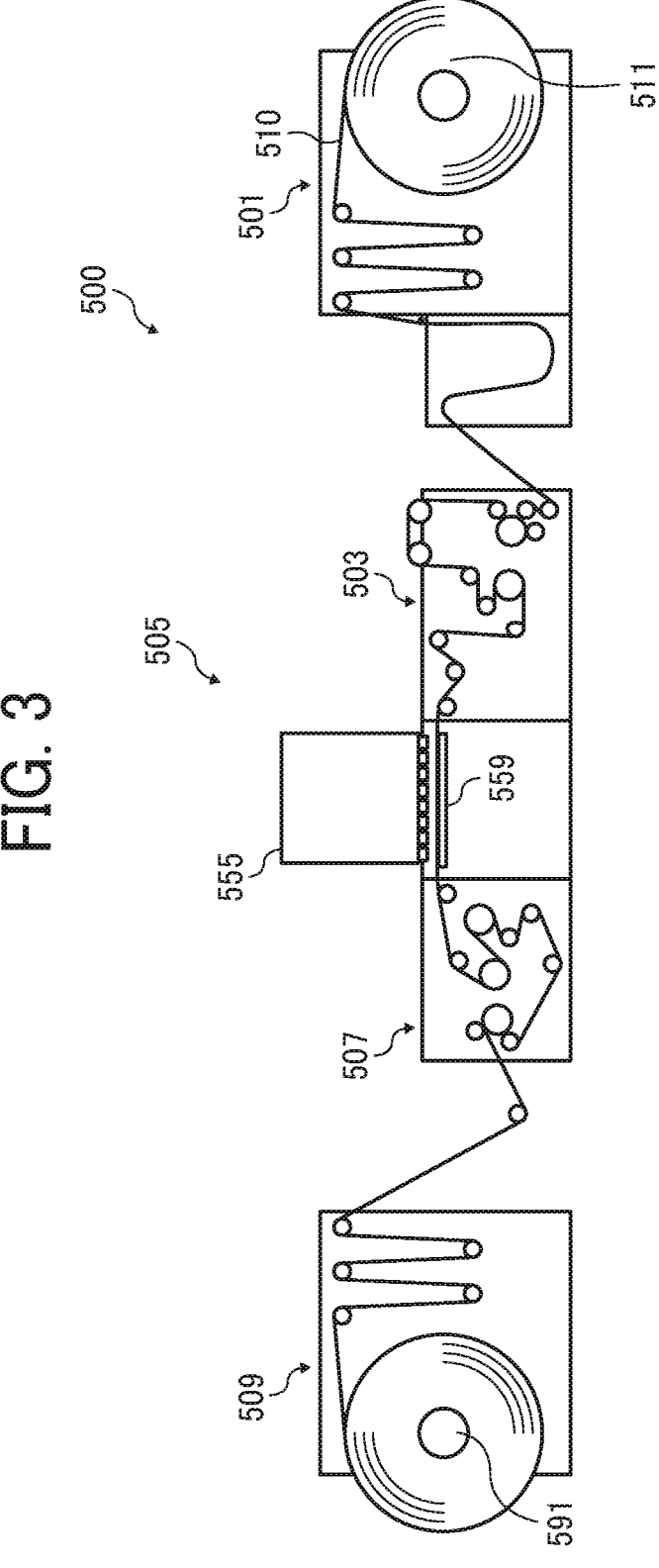
FIG. 3 is a schematic view illustrating one example of a liquid discharge apparatus according to the embodiment.

FIG. 3 is a schematic view illustrating a liquid discharge apparatus including the head module 100 described above. Examples of the liquid discharge apparatus of the present embodiment include a recording apparatus, a printing apparatus, and an image forming apparatus. In addition, the liquid discharge apparatus of the present embodiment can be referred to as an apparatus for discharging liquid.

In FIG. 3, a printing apparatus 500 as one example of the liquid discharge apparatus includes, for example, a loading unit 501, a guide conveyance unit 503, a printing unit 505, a drying unit 507, and an ejection unit 509. A continuous member 510 is loaded into the loading unit 501. The guide conveyance unit 503 guides and conveys the continuous member 510 which has been loaded from the loading unit 501 to the printing unit 505. The printing unit 505 performs printing on the continuous member 510. In the printing, liquid is discharged to the continuous member 510 to form an image on the continuous member 510. The drying unit 507 dries the continuous member 510 on which the printing has been performed. The ejection unit 509 ejects the continuous member 510 which has been dried.

The continuous member 510 is fed from a winding roller 511 of the loading unit 501. The fed continuous member 510 is guided and conveyed by rollers of the loading unit 501, the guide conveyance unit 503, the drying unit 507, and the ejection unit 509, and is then wound around a winding roller 591 of the ejection unit 509.

The printing unit 505 includes, for example, a head unit 550. The continuous member 510 is conveyed on a conveyance guide member 559 disposed opposite the head unit 550, so that an image is formed on the continuous member 510 by liquid to be discharged from the head unit 550. In the disclosure of this specification, in disclosure of this specification, the terms such as "image forming", "recording", "typing", "copying", "printing, and "shaping" are considered as synonyms.

Figure 4A:
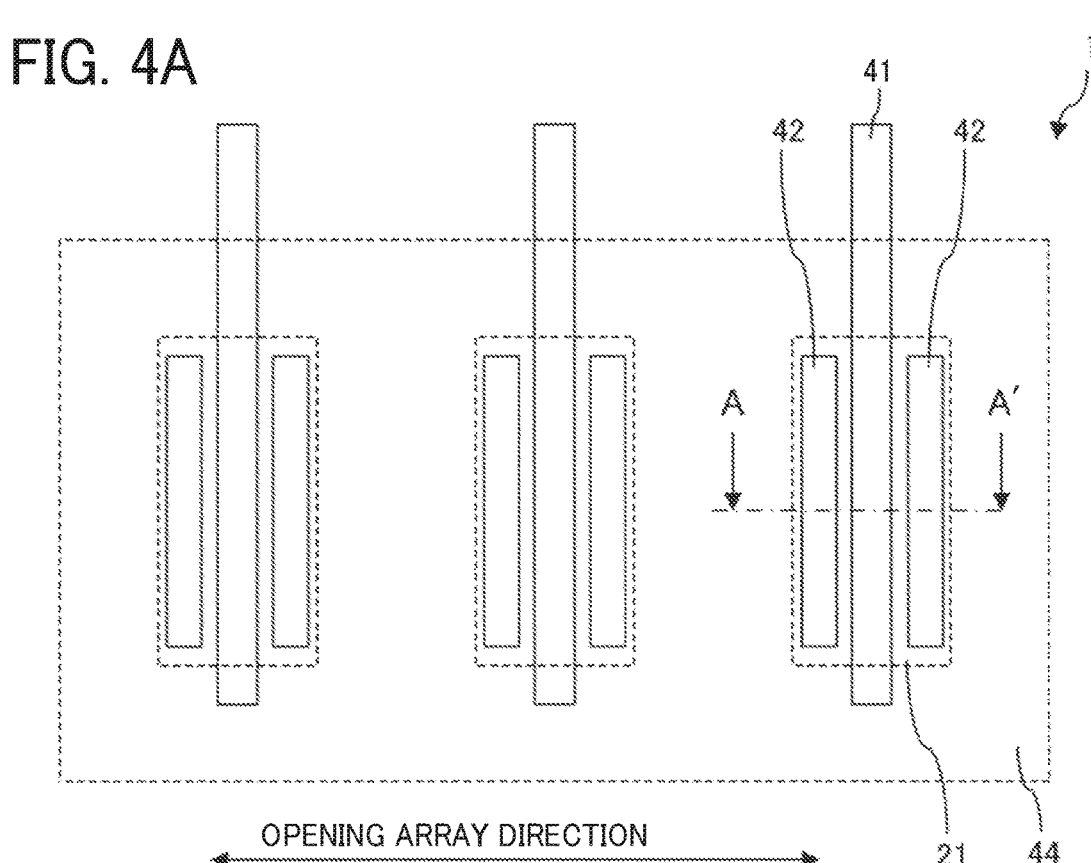
FIGS. 4A and 4B are plan views schematically illustrating one example of a piezoelectric actuator according to the embodiment.
Figure 4B:
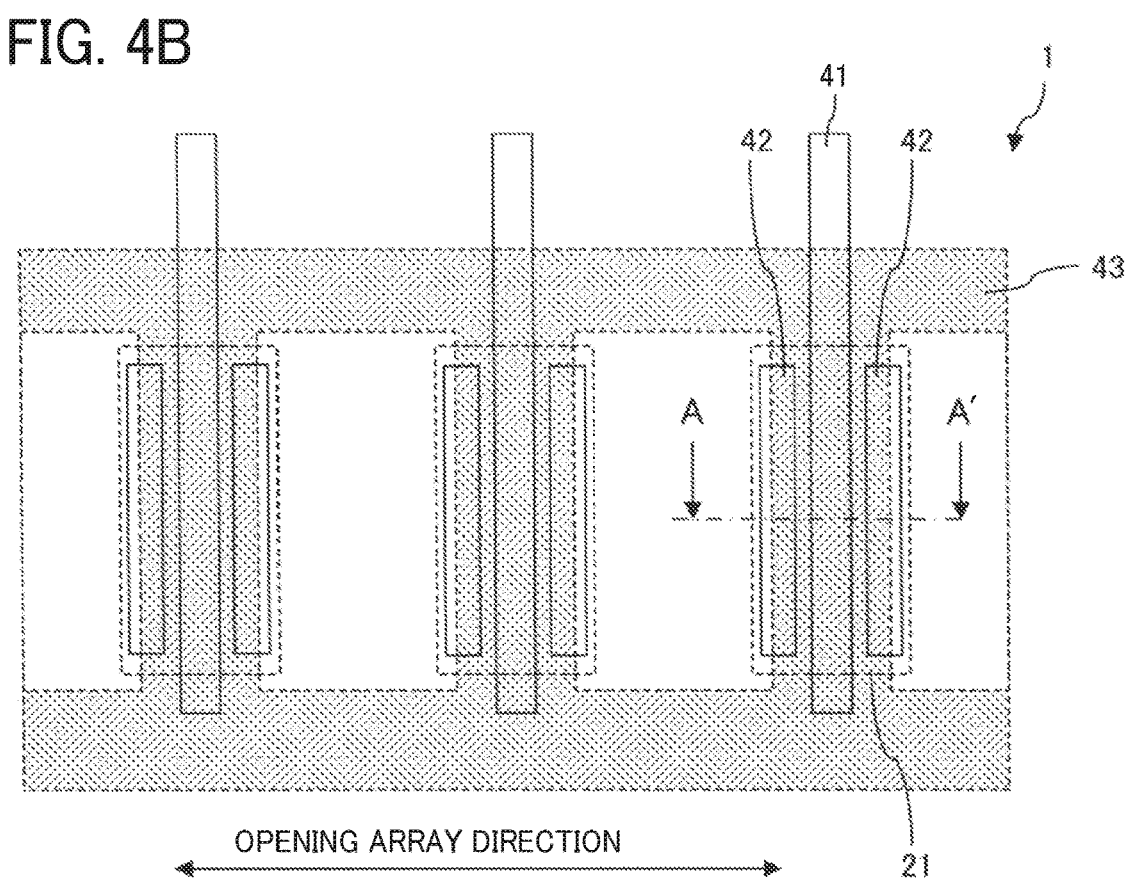
Figures 5, 6:
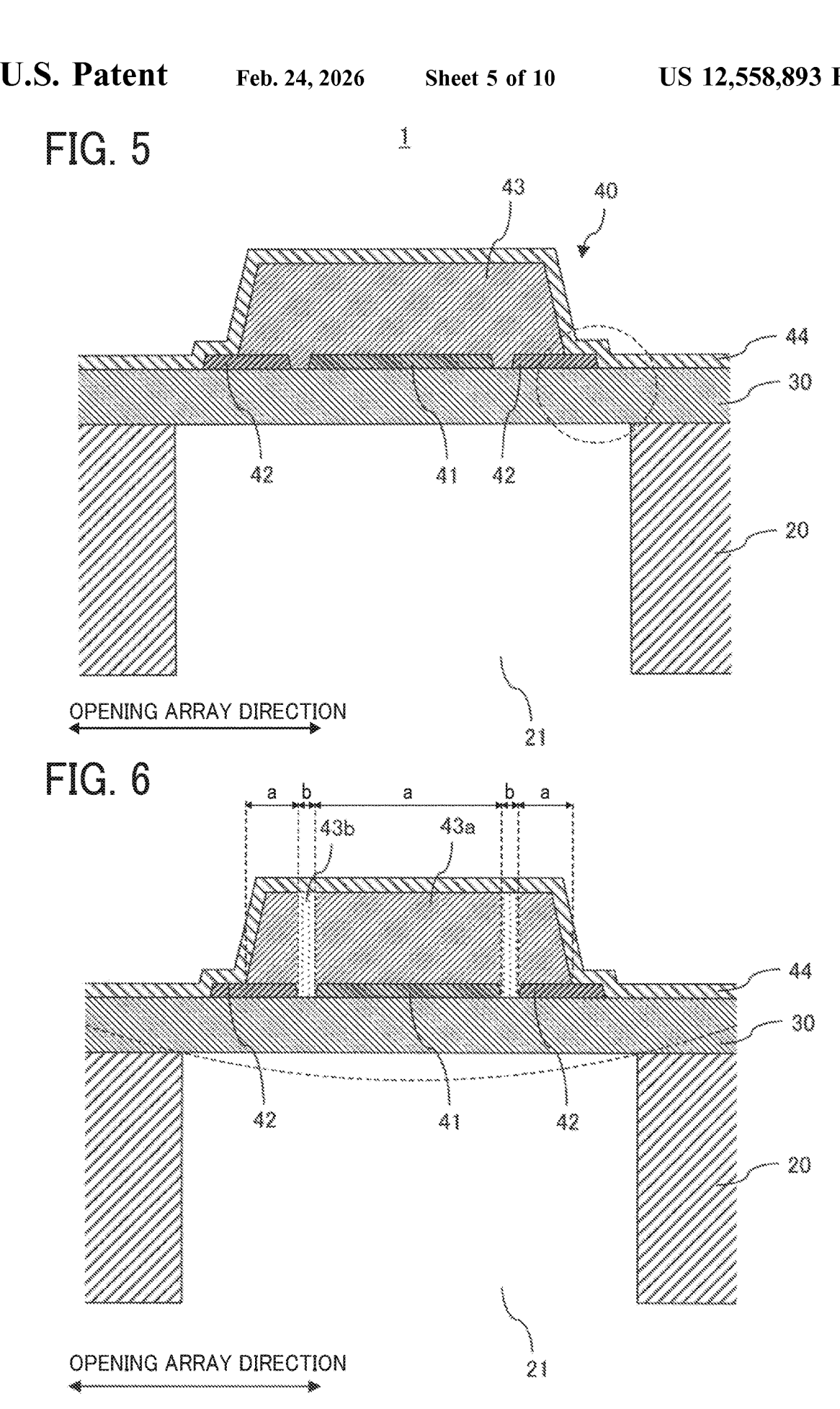
FIG. 5 is a sectional view schematically illustrating one example of the piezoelectric actuator according to the embodiment.
FIG. 6 is a sectional view schematically illustrating a crystal state of a piezoelectric body illustrated in FIG. 5.

FIGS. 4A and 4B are plan views schematically illustrating one example of a piezoelectric actuator 1 according to the present embodiment. FIG. 5 is a sectional view schematically illustrating one example of the piezoelectric actuator 1 according to the present embodiment. FIG. 5 is the sectional view along the line A-A' of each of FIGS. 4A and 4B. In the present embodiment, one direction (second direction) in a planar direction of the substrate is set to an opening array direction.

FIG. 4B is a supplementary diagram of FIG. 4A, and illustrates one example of a location in which a piezoelectric body 43 is formed. In FIG. 4B, the piezoelectric body 43 is illustrated with a pattern. As illustrated in FIG. 4B, the piezoelectric body 43 is arranged inside relative to both end portions of the opening 21 in the one direction (the opening array direction). Hereinafter, the term "FIG. 4" represents FIG. 4A unless otherwise noted.

The piezoelectric actuator 1 of this example includes the channel substrate 20, the diaphragm 30, and the piezoelectric element 40. The channel substrate 20 (also simply referred to as a substrate) includes the opening 21. The opening 21 can provide a moving area of the diaphragm 30. If the piezoelectric actuator 1 is used in a liquid discharge heard, the opening 21 serves as a pressure liquid chamber.

On the channel substrate 20, multiple openings 21 is arranged. The openings 21 are arrayed in one direction (second direction) in a planar direction of the channel substrate 20, and a direction in which the openings 21 are arrayed is referred to as the opening array direction. In the drawings, the opening array direction is indicated by an arrow. In a case of a liquid discharge head, the opening array direction is the same as a nozzle array direction. When the term "the substrate" is used, it represents the channel substrate 20 unless otherwise noted.

For the channel substrate 20 of the present embodiment, single-crystal silicon having a thickness of 80 μm is used. The use of the single-crystal silicon enables the opening 21 to be formed finely and precisely by a semiconductor processing technique (e.g., photolithography). As for the opening 21 of the present embodiment, a width of in the opening array direction is 60 μm, and a width in a direction perpendicular to the opening array direction is 700 μm. The openings 21 are spaced apart by 85 μm (pitch) in the opening array direction. A width of the opening 21 in each direction can be set to an appropriate value based on specifications needed for the piezoelectric actuator and the liquid discharge head.

The material for the opening 21 is not limited to silicon, and an optional material suitable for a method for processing the opening 21 can be used. Examples of the optional material include metal, alloy, ceramic, and semiconductor.

The diaphragm 30 is formed on one face of the channel substrate 20 such that one region of the opening 21 is covered.

Although a reference number of the piezoelectric element 40 is omitted in FIG. 4, a diagram illustrated in FIG. 4 can be considered as a surface diagram of the piezoelectric element 40. As illustrated in FIG. 5, the piezoelectric element 40 is provided on the diaphragm 30, and includes a first lower-portion electrode 41, a second lower-portion electrode 42, the piezoelectric body 43, and an upper-portion electrode 44 that are sequentially laminated on a side opposite the channel substrate 20.

A lower electrode in the present embodiment includes the first lower-portion electrode 41 and the second lower-portion electrode 42. The first lower-portion electrode 41 and the second lower-portion electrode 42 can be collectively referred to as lower-portion electrodes 41 and 42. The lower-portion electrodes 41 and 42 can be referred to as lower electrodes 41 and 42, and the upper-portion electrode 44 can be referred to as an upper electrode 44.

In the present embodiment, the first lower electrode 41 and the second lower electrode 42 are electrically independent. As illustrated in FIG. 4, in a plane of the channel substrate 20 (also referred to as the substrate) in the planar direction, the second lower electrode 42 of the present embodiment is separated from the first lower electrode 41, and is formed on each of both sides of the first lower electrode 41 in the opening array direction. With such a configuration, the first lower electrode 41 functions as an individual electrode when the piezoelectric element 40 is driven.

Each of the first lower electrodes 41 and the second lower electrodes 42 extends in a first direction orthogonal to the opening array direction (second direction) as illustrated in FIGS. 4A and 4B.

Thus, a piezoelectric actuator includes: a substrate 20 having an opening 21; a diaphragm 30: having a first face on one face of the substrate 20; and facing the opening 21; and a piezoelectric element 40 including: a lower electrode 41, 42; a piezoelectric body 43; and an upper electrode 44, and the lower electrode 41, 42, the piezoelectric body 43, and the upper electrode 44 being sequentially laminated on a second face opposite to the first face of the diaphragm 30 in a lamination direction (vertical direction in FIG. 5), wherein the lower electrode 41, 42 includes: a first lower electrode 41 extending in a first direction (vertical direction in FIG. 4A); and multiple second lower electrodes 42: each extending in the first direction; disposed on each of both sides of the first lower electrode 41 in a second direction (opening array direction) orthogonal to the first direction; and separated from the first lower electrode 41 in the second direction, the piezoelectric body 43 is interior of both ends of the opening 21 in the second direction, and the first lower electrode 41 is interior of both ends of the piezoelectric body 43 in the second direction.

The arrangement of the second lower electrode 42 can reduce an area of the piezoelectric body 43 to be formed on the diaphragm 30, so that an area of the piezoelectric body 43 the crystal state of which is inferior can be reduced as described below. Accordingly, a failure such as a crack in the piezoelectric body 43 can be reduced, and degradation of the diaphragm 30 can also be reduced. Even if an electric current does not flow through the second lower electrode 42, the second lower electrode 42 is called the electrode, or may be referred to as a metal member.

The piezoelectric element 40 is, for example, produced by forming the diaphragm 30, the lower electrodes 41 and 42, the piezoelectric body 43, and the upper electrode 44 on a silicon (Si) substrate. For example, a method such as a chemical vapor deposition (CVD) method, a sputtering method, an atomic layer deposition (ALD) method, and a spin coat method is employed to deposit a film, and patterning is performed by photolithography, so that the piezoelectric element 40 can be produced.

As illustrated in FIG. 5, the upper electrode 44 is formed so as to cover an upper face and a side face of the piezoelectric body 43. That is, in a cross section along a direction perpendicular to a planar direction of the substrate, the upper electrode 44 is formed so as to cover an upper face and a side face of the piezoelectric body 43 inside the opening 21. Accordingly, the upper electrode 44 functions as a common electrode when the piezoelectric element 40 is driven.

Examples of materials for the diaphragm 30 can include a silicon-based compound and a zirconium-based compound. Examples of the silicon-based compound can include monocrystalline silicon (i.e., single-crystal silicon), polycrystalline silicon, silicon dioxide ($SiO_2$), silicon nitride ($Si_3N_4$), and silicon carbide (SiC), whereas an example of the zirconium-based compound can include zirconium dioxide ($ZrO_2$). The diaphragm 30 has a thickness that can be appropriately set depending on a distortion amount or a vibration characteristic desired for the piezoelectric actuator. An appropriate thickness of the diaphragm 30 falls within a range of 1 μm to 3 μm, for example.

Materials for the first lower electrode 41, the second lower electrode 42, and the upper electrode 44 can be appropriately selected. The first lower electrode 41, the second lower electrode 42, and the upper electrode 44 are preferably formed of the same material. The use of the same material enables the first lower electrode 41, the second lower electrode 42, and the upper electrode 44 to be formed by the same process. The piezoelectric body 43 has crystals that grow on the first lower electrode 41, and crystals that grow on the second lower electrode 42. The use of the same material also enables the crystals which grow on the first lower electrode 41 and the crystals which grow on the second lower electrode 42 to be in a similar crystal state. In addition, the use of the same material can maintain good adhesion of the second lower electrode 42 to the upper electrode 44.

The material for the first lower electrode 41, the second lower electrode 42, and the upper electrode 44 can include metal such as platinum (Pt) and iridium (Ir), and conductive oxide such as iridium dioxide ($IrO_2$), tin oxide (SnO), and indium dioxide ($InO_2$).

Preferably, the first lower electrode 41, the second lower electrode 42, and the upper electrode 44 are formed of the same material, and include at least Pt or Ir. In this case, the use of lead zirconate titanate (PZT) for the piezoelectric body 43 can further prevent lead from being diffused across the diaphragm 30.

Moreover, FIG. 5 is a sectional view not only along the opening array direction but also illustrating one opening 21. In the sectional view illustrating such one opening 21, the piezoelectric body 43 is formed inside relative to a width of the opening 21. In other words, in the sectional view illustrated in FIG. 5, a maximum length from one end to the other end of the piezoelectric body 43 in the opening array direction is shorter than a minimum length from one end to the other end of the opening 21 in the opening array direction. In other words, the piezoelectric body 43 is arranged inside relative to both end portions of the opening 21 in the one direction (e.g., the opening array direction).

In the sectional view illustrated in FIG. 5, moreover, the first lower electrode 41 is formed inside relative to a width of the piezoelectric body 43. In other words, the first lower electrode 41 is arranged inside relative to both end portions of the piezoelectric body 43 in the one direction (e.g., the opening array direction). In other words, in the sectional view illustrated in FIG. 5, a maximum length from one end to the other end of the first lower electrode 41 in the opening array direction is shorter than a minimum length from one end to the other end of the piezoelectric body 43 in the opening array direction. Furthermore, in the sectional view illustrated in FIG. 5, the second lower electrode 42 is arranged such that the piezoelectric body 43 is formed on one portion of the second lower electrode 42.

In the sectional view illustrated in FIG. 5, a width of each of the first lower electrode 41 and the piezoelectric body 43 can be appropriately set depending on a desired deformation amount or a processing method of the piezoelectric actuator 1. For example, a width of the opening 21 may be set to 60 μm. In such a case, a width of the second lower electrode 42 can be set to 50 μm, and a width of the first lower electrode 41 can be set to 40 μm. Thus, a good displacement characteristic can be obtained.

The piezoelectric body 43, for example, can be made of a material such as PZT. For example, PZT in which a ratio of zirconium (Zr) to titanium (Ti) is adjusted to 53:47 can have a good characteristic. A ratio of each component of PZT can be appropriately adjusted depending on a formation method, a condition, or target performance of a piezoelectric body. For example, a ratio of Zr to Ti can be adjusted to a range from 43:57 to 63:37, so that a good piezoelectric characteristic can be obtained. In addition, an element such as manganese (Mn), niobium (Nb), molybdenum (Mo), and cobalt (Co) can be added (doped) to PZT.

A thickness of the piezoelectric body 43 can be appropriately set depending on performance to be desired for the piezoelectric actuator 1. In the present embodiment, the piezoelectric body 43 preferably has a thickness in a range of 1 μm to 4 μm.

A crystal state of the piezoelectric body 43 is important in obtaining a good displacement characteristic. If the piezoelectric actuator 1 of the present embodiment is used in a liquid discharge head, a crystal state of the piezoelectric body 43 is important in discharging liquid (e.g., ink). In a case where a crystal state of the piezoelectric body 43 is inferior, a desired displacement amount cannot be obtained. Such a case may cause an issue such as degradation in dischargeability over time.

The crystals of the piezoelectric body 43 grow with a strong influence from an underlying substance. For example, the piezoelectric body 43 to be formed on the first lower electrode 41 and the second lower electrode 42, and the piezoelectric body 43 to be formed on the diaphragm 30 have different crystal states. FIG. 6 is a diagram schematically illustrating difference in crystal states. FIG. 6 is a schematic sectional view similar to FIG. 5.

As illustrated in FIG. 6, the piezoelectric body 43 has areas that are formed on the lower electrodes 41 and 42 as underlying substances, and an area that is formed on the diaphragm 30 as an underlying substance. In the piezoelectric body 43, each of the areas formed on the lower electrodes 41 and 42 is in a crystal state a, whereas the area formed on the diaphragm 30 is in a crystal state b. In the piezoelectric body 43 illustrated in FIG. 6, the area in the crystal state a is indicated by a reference code 43*a* (also referred to as a piezoelectric body 43*a*), and the area in the crystal state b is indicated by a reference code 43*b* (also referred to as a piezoelectric body area 43*b*) for the sake of description. Meanwhile, FIG. 6 is a diagram schematically illustrating the presence of areas in different crystal states in the piezoelectric body 43 depending on underlying substances. Thus, crystals in the area in the crystal state a may not always simply grow in a thickness direction in a linear manner. Similarly, crystals in the area in the crystal state b may not always simply grow in a thickness direction in a linear manner. The areas in the crystal states a and b can be widened or narrowed in the thickness direction as crystals in the areas in the crystal states a and b grow.

The crystals which have grown in the area in the crystal state a on the lower electrodes 41 and 42 are provided in a (100) preferred orientation and have a large displacement amount. Thus, the crystals in the area in the crystal state a form a fine crystalline configuration. On the other hand, the crystals which have grown in the area in the crystal state b are provided in a random orientation and have many defects. Consequently, the crystals in the area in the crystal state b do not tend to form a fine crystalline configuration. Since the crystal state b is brittle and easily cracked, driving of the area in the crystal state a causes cracking to occur more easily within the area in the crystal state b. Accordingly, the area in the crystal state b is preferably reduced as much as possible.

The driving of the area in the crystal state a may cause cracking to occur in a boundary between the crystal state "a" and the crystal state "b". However, cracking that occurs within the area in the crystal state b exerts more influence on the piezoelectric body 43 as a whole by the following reasons.

When a voltage is applied between the upper electrode 44 and the first lower electrode 41 of the piezoelectric element 40 to drive the piezoelectric element 40, stress is generated.

The stress to be generated herein causes the piezoelectric body 43 between the upper electrode 44 and the first lower electrode 41 to contract in a planar direction (the opening array direction illustrated in FIG. 6) of the diaphragm 30. As a result, when the piezoelectric element 40 is driven, the piezoelectric element 40 is deformed such that a lower face of the diaphragm 30 (a face on the substrate side) is protrusively shaped toward the substrate side as indicated by a broken-line illustrated in FIG. 6. In such a case, from a middle portion of the first lower electrode 41 toward the outside in the opening array direction illustrated in FIG. 6, a shape of the lower face of the diaphragm 30 is gradually changed from a downward protruding shape to an upward protruding shape. Herein, since the upward protruding shape is provided in an area outside the first lower electrode 41, stress that pulls the piezoelectric body 43 in the opening array direction is generated in an area of the first lower electrode 41. In a case where the area in which such stress is generated is in the crystal state b, the piezoelectric body 43 is cracked. Consequently, the larger the area in the crystal state b, the higher the possibility that piezoelectric element 40 is damaged. In other words, in an area of the piezoelectric body 43 outside the first lower electrode 41, reduction in an area in the crystal state b can reduce a possibility of the damage associated with driving of the piezoelectric element 40.

The first lower electrode 41 and the second lower electrode 42 in the present embodiment are electrically independent. Accordingly, with the driving of the piezoelectric element 40 (with application of voltage), the piezoelectric body 43 in the area in which the second lower electrode 42 is formed receives an electric field that is different from an electric field that is applied to the piezoelectric body 43 in the area in which the first lower electrode 41 is formed. If a potential of the second lower electrode 42 is substantially the same as or close to a potential of the upper electrode 44, an electric field that is applied to the piezoelectric body 43 in the area in which the second lower electrode 42 is formed is reduced, and contraction of the piezoelectric body 43 is reduced. As a result, stress due to the driving of the piezoelectric element 40 is not generated in the piezoelectric body 43 in the area in which the second lower electrode 42 is formed, so that load stress can be reduced, and cracks due to stress concentration can be reduced.

According to the present embodiment, as illustrated in FIGS. 4 and 5, the second lower electrode 42 is spaced apart from the first lower electrode 41 in the opening array direction. Moreover, as illustrated in FIGS. 4 and 5, the second lower electrode 42 is formed on each of both sides of the first lower electrode 41 in the opening array direction. In other words, the second lower electrode 42, when viewed in plan and cross section, is arranged outside the piezoelectric element 40 relative to the first lower electrode 41, and is arranged such that one portion of the second lower electrode 42 on the side near the first lower electrode 41 overlaps the piezoelectric body 43.

As described above, the crystal state a of the piezoelectric body 43 formed on the lower electrode is superior to the crystal state b of the piezoelectric body 43 formed on the diaphragm 30. Accordingly, with the lower electrode including the first lower electrode 41 and the second lower electrode 42, an area of the piezoelectric body 43*a* in a good crystal state can be increased. In other words, and area of the piezoelectric body 43*b* in an inferior crystal state can be reduced, and a failure in the piezoelectric body 43 can be reduced. For example, an area of the piezoelectric body 43*a* in a good crystal state can be larger than that in the comparative example described below.

Figures 9, 10:
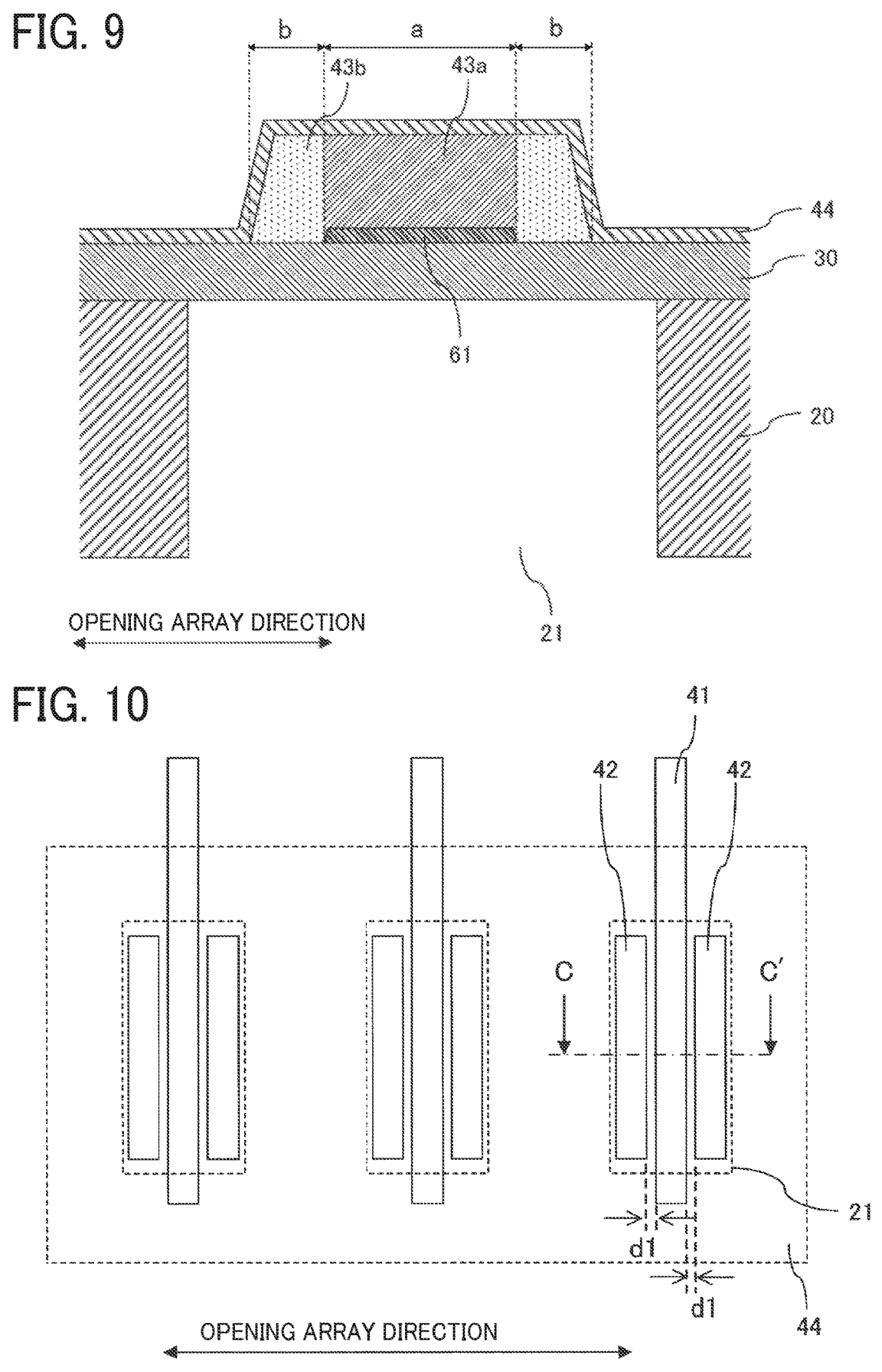

In the present embodiment, moreover, since an area of the lower electrodes 41 and 42 on the diaphragm 30 can be larger than that in the comparative example below, diffusion of lead from the piezoelectric body 43 can be prevented by the lower electrodes 41 and 42, and diffusion of lead into the diaphragm 30 can be reduced. Accordingly, in the present embodiment, the piezoelectric actuator 1 with enhanced reliability can be obtained FIG. 7 is a plan view illustrating a piezoelectric actuator according to a comparative example and similar to the plan view illustrated in FIG. 4. FIG. 8 is a sectional view illustrating the piezoelectric actuator according to the comparative example and similar to the sectional view illustrated in FIG. 5. Moreover, FIG. 8 is a sectional view along the line B-B' of FIG. 7. FIG. 9 is a sectional view schematically illustrating a crystal state in the comparative example and similar to the sectional view illustrated in FIG. 6.

As illustrated in FIGS. 7 through 9, since a lower electrode 61 in the comparative example does not include a first lower electrode or a second lower electrode, an area having no lower electrode is larger than the above-described embodiment. Consequently, a piezoelectric body 43 has a larger area that is in an inferior crystal state. That is, an area of a piezoelectric body 43b in a crystal state b is increased. Consequently, not only a displacement characteristic of a piezoelectric body 43 is degraded, but also the piezoelectric body 43 is cracked more easily. Thus, in the comparative example, a piezoelectric actuator has lower reliability.

In the comparative example, since an area in which the lower electrode 61 is not present is large, an amount of lead to be diffused from the piezoelectric body 43 into a diaphragm 30 is greater than that of the above-described embodiment. Consequently, a state of the diaphragm 30 is changed. For example, rigidity of the diaphragm 30 is changed, or strength of the diaphragm 30 is lowered. In the comparative example, therefore, the piezoelectric actuator not only does not tend to acquire prescribed dischargeability, but also is brittle and liable to be damaged.

In the comparative example, it is conceivable that attempts can be made for increasing an area of the lower electrode 61 to increase an area of the piezoelectric body 43 in a good crystal state and preventing lead from being diffused into the diaphragm 30. For example, in FIG. 8, it is conceivable that an attempt can be made for widening the lower electrode 61 in an opening array direction. However, in a case where the lower electrode 61 is widened in the opening array direction, an area in which the lower electrode 61 overlaps an upper electrode 44 is increased. That is, an area of the piezoelectric body 43 in which stress is generated by an electric field to be applied by driving of the piezoelectric element is increased. As a result, in an area outside relative to the lower electrode of the piezoelectric element, load stress associated with the driving of the piezoelectric element is increased, and an area outside the lower electrode 61 is narrowed. Consequently, the load stress is concentrated in an area in a crystal state b. In the comparative example, since the load stress associated with the driving of the piezoelectric element is concentrated in an area in a crystal state b outside the lower electrode 61, an increase in an area of a piezoelectric body 43a by an increase in an area of the lower electrode 61 (reduction in an area of a piezoelectric body 43b) is difficult.

In the present embodiment, size and arrangement of the second lower electrode 42 can be appropriately changed. In the example illustrated in FIG. 5, the second lower electrode 42 is formed across an area from the inside to the outside of the piezoelectric body 43, and contacts the upper electrode 44 at the outside of the piezoelectric body 43. Accordingly, the second lower electrode 42 contacts the upper electrode 44, so that an electric field is not applied to the piezoelectric body 43 in an area outside the first lower electrode 41 by driving of the piezoelectric element 40. Thus, load stress of the diaphragm 30 and the piezoelectric body 43 provided outside relative to the first lower electrode 41 can be reduced, thereby acquiring an advantage of reducing a situation in which the diaphragm 30 is cracked or damaged near an end portion of the opening 21. However, the second lower electrode 42 is not necessarily in contact with the upper electrode 44 as described below.

When the piezoelectric element 40 is driven, the first lower electrode 41 functions as an individual electrode, and the upper electrode 44 functions as a common electrode. The second lower electrode 42 functions as a part of the common electrode when the second lower electrode 42 is in contact with the upper electrode 44. Thus, when the piezoelectric element 40 is driven, an electric field is not generated between the second lower electrode 42 and the upper electrode 44, and the piezoelectric body 43 between the second lower electrode 42 and upper electrode 44 does not contribute to displacement of the diaphragm 30. This can reduce a situation in which the diaphragm 30 is cracked or damaged near the end portion of the opening 21. The second lower electrode 42 and the upper electrode 44 may be formed of the same material. In such a case, the use of the same material can enhance close-contact between the second lower electrode 42 and the upper electrode 44, thereby reducing a failure such as peeling.

A distance between the first lower electrode 41 and the second lower electrode 42 is preferably greater than a distance between the first lower electrode 41 and the upper electrode 44 in a direction perpendicular to a planar direction of the channel substrate 20. In such a case, not only pressure resistance of the piezoelectric element 40 per se can be maintained, but also dielectric breakdown can be avoided.

Although a distance between the first lower electrode 41 and the second lower electrode 42 is preferably one value, a distance between the first lower electrode 41 and the second lower electrode 42 may differ depending on location. For example, in the present embodiment, the second lower electrode 42 is arranged on each of both sides of the first lower electrode 41. In this case, a distance between the first lower electrode 41 and a second lower electrode 42 on one side of the first lower electrode 41 may differ from a distance between the first lower electrode 41 and a second lower electrode 42 on the other side of the first lower electrode 41. If such distances differ depending on location, each of the distances can be set to a shortest distance between the first lower electrode 41 and the second lower electrode 42.

The direction perpendicular to the planar direction of the channel substrate 20 also corresponds to a thickness direction of the piezoelectric body 43. Thus, a distance between the first lower electrode 41 and the upper electrode 44 in the direction perpendicular to the planar direction of the channel substrate 20 is a value that is determined by subtracting a thickness of the first lower electrode 41 from a thickness of the piezoelectric body 43.

Figure 11:
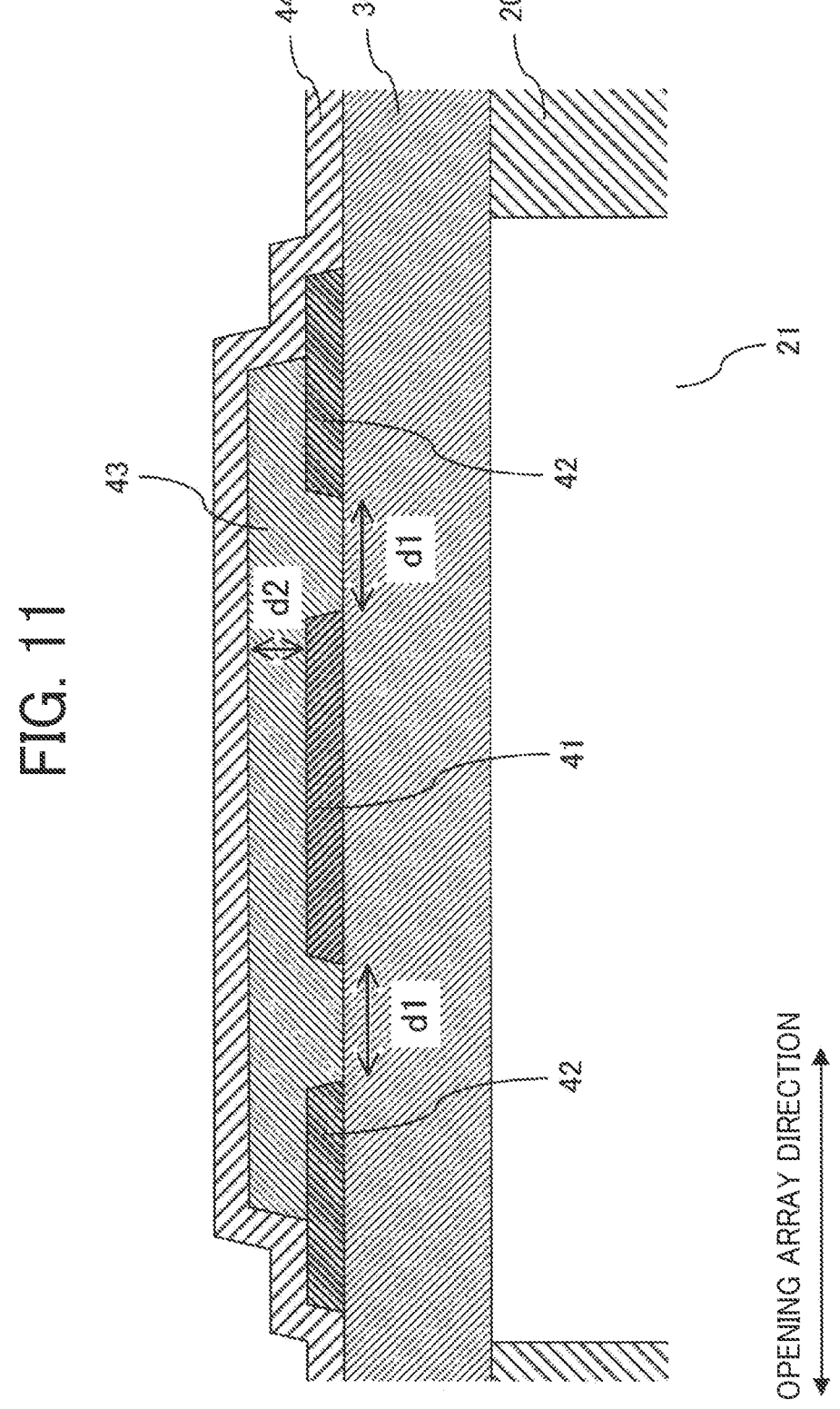
FIG. 11 is a sectional view along the line C-C' of FIG. 10.

Such an example is described with reference to FIGS. 10 and 11. FIG. 10 is a plan view illustrating the example and similar to the plan view illustrated in FIG. 1. FIG. 11 is a sectional view schematically illustrating a main portion of the example and similar to the sectional view illustrated in FIG. 5. FIG. 11 corresponds to a cross section along the line C-C' of FIG. 10.

In the example as illustrated in FIGS. 10 and 11, the first lower electrode 41 and the second lower electrode 42 are spaced apart by a distance d1, and the distance d1 is larger than a distance d2 between the first lower electrode 41 and the upper electrode 44 in a direction perpendicular to the planar direction of the channel substrate 20. That is, a relation of d1>d2 is provided. Accordingly, an electrical failure such as dielectric breakdown can be reduced.

As illustrated in FIG. 11, in a case where the first lower electrode 41 and/or the second lower electrode 42 has a slanting shape in which a thickness of the first lower electrode 41 and/or the second lower electrode 42 becomes smaller as closer to an end portion of the first lower electrode 41 and/or the second lower electrode 42, a distance between an end portion of the first lower electrode 41 and an end portion of the second lower electrode 42 can be set to a distance d1 between the first lower electrode 41 and the second lower electrode 42. From a standpoint of dielectric breakdown avoidance, the distance d1 between the first lower electrode 41 and the second lower electrode 42 can be set to a distance of location where the first lower electrode 41 and the second lower electrode 42 are closest to each other.

The distance d1 between the first lower electrode 41 and the second lower electrode 42 is preferably short from a standpoint of reduction of lead diffusion from the piezoelectric body 43 to the diaphragm 30 and a standpoint of reduction of an area in a crystal state b (an area of the piezoelectric body 43b). An upper limit of the distance d1 between the first lower electrode 41 and the second lower electrode 42 is not particularly limited, and can be appropriately selected. For example, an upper limit of the distance d1 can be appropriately determined based on evaluation such as electrical reliability evaluation and driving durability evaluation.

In the present embodiment, a distance d2 between the first lower electrode 41 and the upper electrode 44 preferably falls within a range of 1 μm to 4 μm. In addition, the distance d1 between the first lower electrode 41 and the second lower electrode 42 preferably falls within a range of 3 μm to 10 μm while satisfying a relation of d1>d2. For example, if the distances d2 and d1 are respectively set to 2 μm and 3 μm, damage of the piezoelectric element 40 due to driving of the piezoelectric element 40 can be reduced, and reliability of the piezoelectric element 40 can be enhanced.

In the present embodiment, the second lower electrode 42 is preferably arranged such that a portion of the second lower electrode 42 positioned outside relative to the piezoelectric body 43 has a thickness that becomes gradually smaller as closer to the end portion. With the second lower electrode 42 having such a shape, deformation in a location outside relative to the piezoelectric body 43 can be gentle, and concentration of stress in the diaphragm 30 can be reduced A portion of each of the multiple second lower electrodes disposed outside of the piezoelectric body has a thickness decreasing toward an end of each of the multiple second lower electrodes in the second direction.

Figure 12:
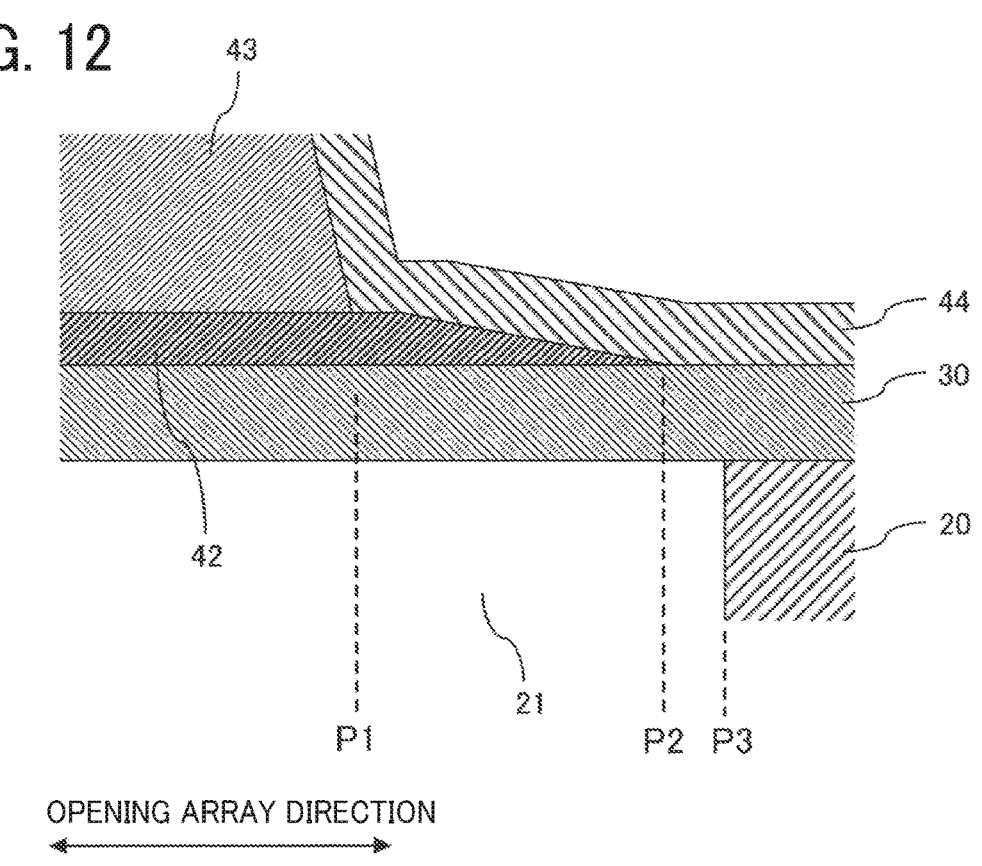
FIG. 12 is an enlarged view of a portion indicated by a broken-line circle illustrated in FIG. 5.

Although such a shape of the second lower electrode 42 is illustrated in FIG. 5, a principal portion of the second lower electrode 42 in FIG. 5 is enlarged in FIG. 12 for the sake of description. FIG. 12 is an enlarged view illustrating a portion indicated by a broken-line circle in FIG. 5. As illustrated in FIG. 12, the second lower electrode 42 has a portion positioned outside relative to the piezoelectric body 43, and a thickness of such a portion becomes gradually smaller as closer to the end portion.

The second lower electrode 42 has an end portion that is positioned outside relative to the piezoelectric body 43 in the opening array direction, and such an end portion of the second lower electrode 42 is preferably positioned between an end portion of the piezoelectric body 43 and an end portion of the opening 21. In this case, the diaphragm 30 can be reinforced. In addition, since the second lower electrode 42 is not provided in the end portion of the opening 21, a displacement amount can be increased.

Each of the multiple second lower electrodes has one end disposed: outside the piezoelectric body in the second direction; and between one of the both ends of the piezoelectric body and one of the both ends of the opening adjacent to the one of the both ends of the of the piezoelectric body in the second direction.

Such relative positions are described with reference to FIG. 12. In FIG. 12, the second lower electrode 42 has an end portion P2 that is positioned outside relative to the piezoelectric body 43 in the opening array direction, and the end portion P2 of the second lower electrode 42 is positioned between an end portion P1 of the piezoelectric body 43 and an end portion P3 of the opening 21.

Figure 13:
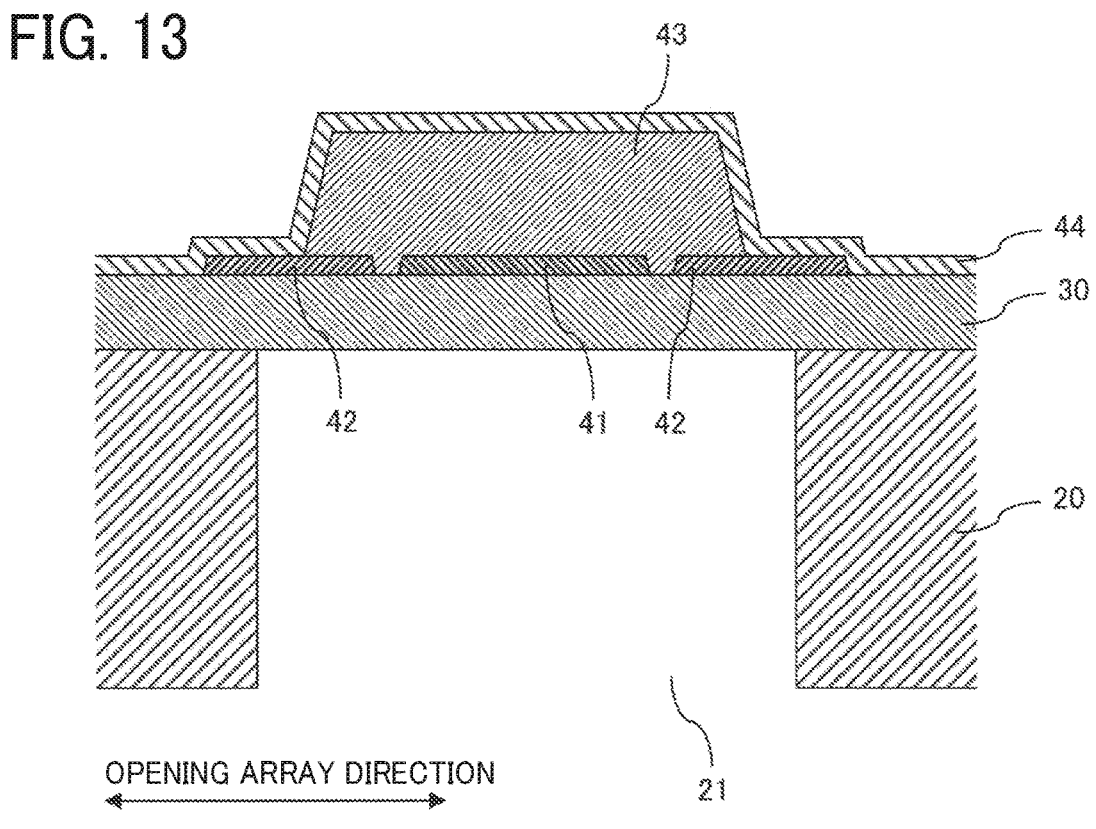
FIG. 13 is a sectional view illustrating another example of the piezoelectric actuator according to the embodiment.

The present embodiment is not limited to the above-described configuration. The second lower electrode 42 may have an end portion that is positioned outside relative to the piezoelectric body 43 in the opening array direction, and such an end portion of the second lower electrode 42 may be positioned outside the opening 21. An example of such a case is described with reference to FIG. 13 that is a sectional view similar to the sectional view illustrated in FIG. 5. As illustrated in FIG. 13, the second lower electrode 42 has an end portion that is positioned outside relative to the piezoelectric body 43 in the opening array direction, and such an end potion of the second lower electrode 42 is positioned outside the opening 21.

The examples illustrated in FIGS. 5 and 12 are preferable to the example illustrated in FIG. 13. However, the example illustrated in FIG. 13 can have another advantage. In the example illustrated in FIG. 13, when patterning is performed on the first lower electrode 41, the second lower electrode 42, and the piezoelectric body 43 by etching, the diaphragm 30 in an area of the opening 21 can be prevented from film reduction due to over-etching. Accordingly, a thickness of the diaphragm 30 can remain as designed.

The second lower electrode 42 illustrated in the plan views of FIG. 4 indicates a portion that contacts the diaphragm 30. In the second lower electrode 42, the portion which contacts the diaphragm 30 is referred to as a bottom face, and a face opposite the bottom face is referred to as a top face for the sake of convenience. In the example illustrated in FIGS. 4 and 5, an area of the top face is smaller than an area of the bottom face as illustrated in the drawings such as FIG. 5.

Next, another example of the present embodiment is described. In the above-described example, the second lower electrode 42 is in contact with the upper electrode 44. However, the second lower electrode 42 and the upper electrode 44 are not necessarily in contact with each other. An example of such a case includes a configuration using a protective film.

In a piezoelectric actuator 1 of this example, a protective film 45 is formed between an upper electrode 44 and top and side faces of a piezoelectric body 43, and between the upper electrode 44 and a second lower electrode 42. The use of the protective film 45 properly protects a piezoelectric element 40 against an external factor. The term "external factor" used herein is, for example, moisture contained in an atmosphere of the piezoelectric element 40. A component such as moisture contained in an atmosphere of the piezoelectric element 40 degrades the piezoelectric body 43. The protective film 45 has a function by which the component, which degrades the piezoelectric body 43, does not tend to contact the piezoelectric body 43.

Figure 14:
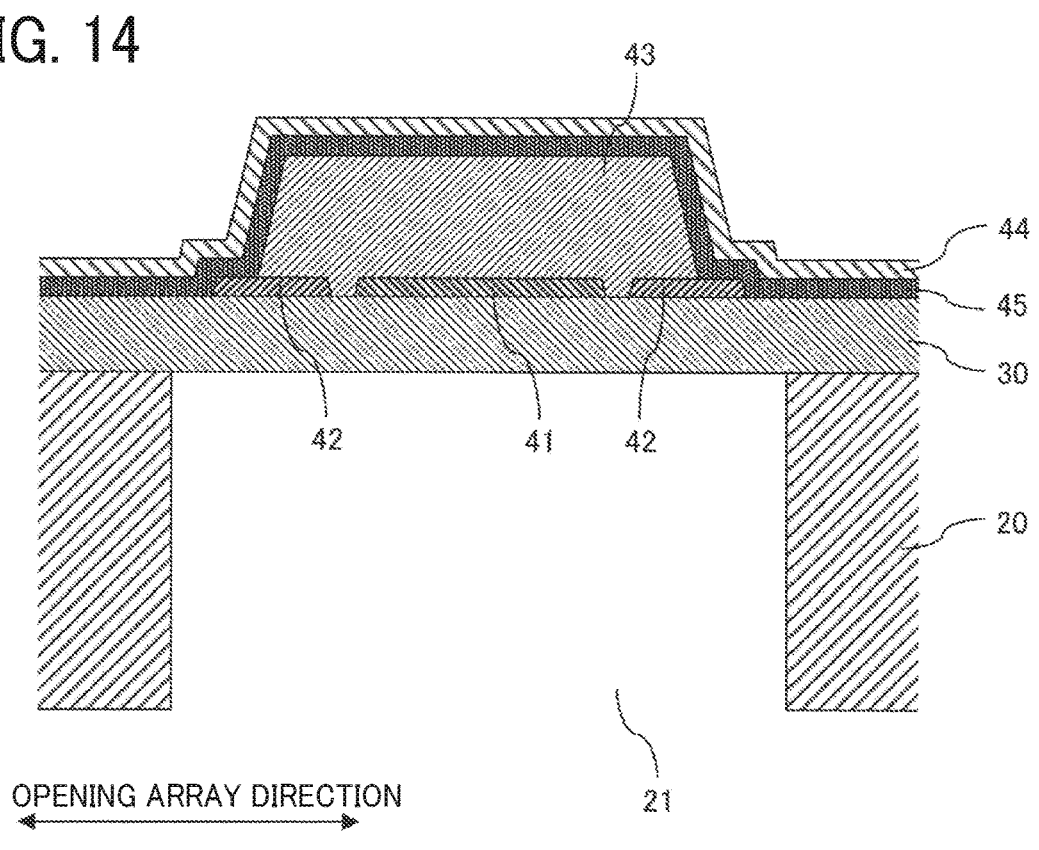
FIG. 14 is a sectional view illustrating another example of the piezoelectric actuator according to the embodiment.

FIG. 14 is a sectional view schematically illustrating such an example and similar to the sectional view illustrated in FIG. 5. As illustrated in FIG. 14, the protective film 45 is formed.

An example of a material for the protective film 45 can include alumina ($Al_2O_3$). Although addition of the protective film 45 increases the number of processes to be done, the piezoelectric element 40 can be protected as described above.

A thickness of the protective film 45 can be appropriately selected, and is preferably 40 nm or more from a barrier standpoint. An increase in the thickness of the protective film 45 enhances barrier performance. Meanwhile, an increase in the thickness of protective film 45 restricts displacement of the piezoelectric element 40, and a displacement amount is reduced. Thus, a thickness of the protective film 45 is preferably 80 nm or less to suppress reduction in a displacement amount.

In this example, if the second lower electrode 42 does not contact the upper electrode 44, a potential of the second lower electrode 42 can be set to an optional potential that does not depend on driving. Moreover, in a case where the second lower electrode 42 is set to another electrode or an electrode (a floating electrode) that is not connected to a unit for setting a potential, the second lower electrode 42 has a potential between a potential of the first lower electrode 41 and a potential of the upper electrode 44. Although a potential of the second lower electrode 42 depends on a potential of the first lower electrode 41, a potential of the upper electrode 44, a thickness of the piezoelectric body 43, and a dielectric constant of the piezoelectric body 43, the second lower electrode 42 has a potential between the potentials of the first lower electrode 41 and the upper electrode 44. Accordingly, when the piezoelectric element 40 is driven, the second lower electrode 42 in the piezoelectric element 40 functions to lower a strength of the electric field to be applied to the piezoelectric body 43 in an area in which the second lower electrode 42 is formed. Therefore, in the piezoelectric body 43 in an area outside relative to the first lower electrode 41, since stress to be generated by driving of the piezoelectric element 40 can be reduced, the piezoelectric element 40 can be prevented from being damaged.

Moreover, a large portion of the diaphragm 30 in an area in which the opening 21 is formed has an upper face on which either the first lower electrode 41 or the second lower electrode 42 is formed. Accordingly, a configuration of the diaphragm 30 is roughly made uniform within the opening 21. Thus, a distortion amount of the diaphragm 30 can be prevented from being concentrated in a particular location in a case where stress associated with driving of the piezoelectric element 40 is applied to the diaphragm 30. Therefore, damage due to driving of the piezoelectric element 40 can be reduced.

Herein, a description is given of one example of a reliability evaluation method with respect to a failure in the piezoelectric actuator according to the present embodiment. Voltage pulses are applied to the first lower electrode 41 and the upper electrode 44 of the piezoelectric actuator described above under the following conditions.

Voltage: 0 V to 40 V

Pulse frequency: 120 kHz

Pulse duty: 50% (time ratio at which a voltage per cycle of pulse is 40 V)

Number of times a pulse is applied: $10^{11}$ times

After the voltage pulse application, damage of the piezoelectric element 40 is observed using a microscope. The absence of a crack or damage due to electric discharge on a component such as the piezoelectric body 43 and the diaphragm 30 is checked, so that whether target reliability is obtainable can be checked.

Such a reliability evaluation method is merely one example, appropriate test conditions can be set depending on use or desired performance of the piezoelectric actuator. The aforementioned test method has been described using an example in which the voltage pulse is applied, but the reliability test method is not limited thereto. A direct current voltage may be applied, or an acceleration test in which an applied voltage, temperature, and humidity are changed may be employed.

Figure 15:
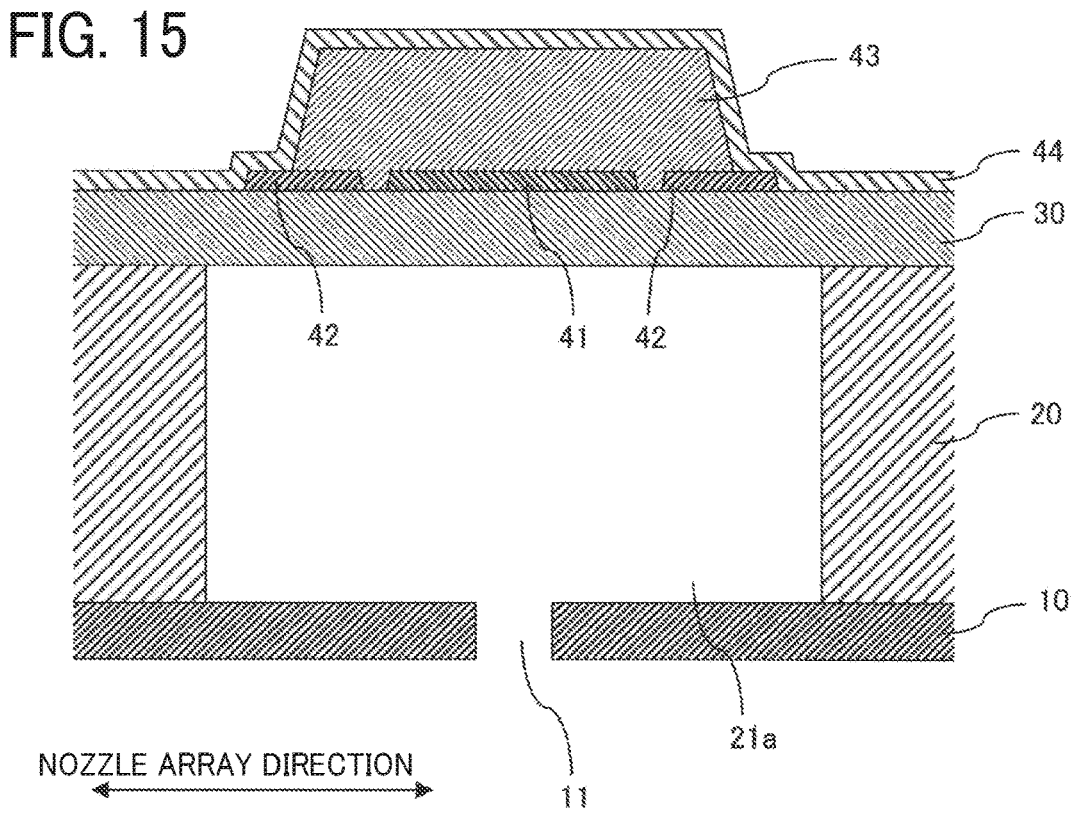
FIG. 15 is a sectional view illustrating one example of a liquid discharge head according to the embodiment.

FIG. 15 is a sectional view illustrating one example of a liquid discharge head according to the present embodiment and similar to the sectional view illustrated in FIG. 5. In FIG. 15, an opening array direction is expressed as a nozzle array direction.

The liquid discharge head of the present embodiment includes the piezoelectric actuator of the present embodiment and a nozzle plate 10 (a nozzle member). The nozzle plate 10 is bonded to a channel substrate 20 on a side opposite a diaphragm 30 of the channel substrate 20 (the substrate), and a nozzle 11 corresponding to a pressure liquid chamber 21a (an opening) is formed on the nozzle plate 10. The liquid discharge head of the present embodiment causes liquid retained in the pressure liquid chamber 21a to be discharged from the nozzle 11.

The pressure liquid chamber 21a corresponds to the above-described opening 21. In a case where the piezoelectric actuator of the present embodiment is used in a liquid discharge head, the opening 21 is referred to as the pressure liquid chamber 21a. In a case where the piezoelectric actuator of the present embodiment is used in the liquid discharge head, the aforementioned opening array direction can be referred to as a nozzle array direction or a pressure chamber array direction.

Since the liquid discharge head of the present embodiment includes the piezoelectric actuator of the present embodiment, a failure in a piezoelectric body can be reduced, and reliability can be enhanced. Therefore, good dischargeability can be acquired.

As described above, the liquid discharge apparatus of the present embodiment can be referred to as an apparatus for discharging liquid. In the disclosure of this specification, "an apparatus for discharging liquid" includes a liquid discharge heard or a liquid discharge unit, and drives the liquid discharge head to discharge liquid. Examples of the apparatus for discharging liquid includes an apparatus that can discharge liquid to a matter to which liquid can be attached, and an apparatus that can discharge liquid toward the air or liquid.

Such an "apparatus for discharging liquid" can also include a unit related to feeding, conveyance, and ejection of a matter to which liquid can be attached, a pre-processing device, and a post-processing device Examples of "the apparatus for discharging liquid" are an image forming apparatus and a three-dimensional shaping apparatus. The image forming apparatus discharges ink to form an image on a sheet. The three-dimensional shaping apparatus discharges shaping liquid to powder layers in which powder is formed in layers so that an object is shaped into a three-dimensional form.

In addition, "the apparatus for discharging liquid" is not limited to an apparatus that renders a meaningful image such as text and graphics visible with discharged liquid. Examples of "the apparatus for discharging liquid" include an apparatus that forms a meaningless image such as patterns, and an apparatus that forms a three-dimensional image.

The term "matter to which liquid can be attached" used in the above description represents a matter to which liquid can be at least temporarily attached. Such a "matter to which liquid can be attached" includes a matter to which liquid is attached and adheres, and a matter to which liquid is attached and penetratingly entered. Particular examples of "the matter to which liquid can adhere" include a recording medium such as paper, a recording sheet, recording paper, a film, and cloth, an electronic component such as an electronic substrate and a piezoelectric element, and a medium such as a powder layer, an organ model, and a test cell. Every matter to which liquid is to be attached is included unless otherwise specified.

A material for "the matter to which liquid can be attached" can be paper, thread, fiber, cloth, leather, metal, plastic, glass, wood, ceramic, a construction material such as wall paper and flooring, or textile for clothing as long as liquid can be even temporarily attached.

Moreover, the term "liquid" used above includes ink, treatment liquid, a deoxyribonucleic acid (DNA) sample, a resist, a pattern material, binder, shaping liquid, solution containing amino acid, protein, or calcium, and dispersion.

Moreover, the term "apparatus for discharging liquid" used above include an apparatus in which a liquid discharge head and a matter to which liquid can be attached are relatively moved, but is not limited thereto. Particularly, examples of "the apparatus for discharging liquid" include a serial-type apparatus in which a liquid discharge head is moved, and a line-type apparatus in which a liquid discharge head is not moved.

Further examples of "the apparatus for discharging liquid" include a treatment liquid applying apparatus and a spray granulation apparatus. The treatment liquid applying apparatus discharges treatment liquid to paper to apply the treatment liquid to a surface of the paper so that the paper surface is modified. The spray granulation apparatus causes composition liquid including a raw material dispersed into solution to be spayed via a nozzle to granulate fine particles of the raw material.

According to the present embodiment, a piezoelectric actuator having enhanced reliability can be provided.

The present disclosure can provide, for example, the following effects.

<Aspect 1>

A piezoelectric actuator includes a substrate, a diaphragm, and a piezoelectric body. The substrate has an opening. The diaphragm is formed on one face of the substrate, and covers one region of the opening. The piezoelectric element is disposed on the diaphragm, and includes a lower electrode, a piezoelectric body, and an upper electrode that are sequentially laminated on a side opposite the substrate. The lower electrode includes a first lower electrode and a second lower electrode. In one direction in a planar direction of the substrate, the piezoelectric body is formed inside relative to both end portions of the opening in the one direction, and the first lower electrode is formed inside relative to both end portions of the piezoelectric body in the one direction. In the one direction, the second lower electrode is separated from the first lower electrode and is formed on each of both sides of the first lower electrode in the one direction.

<Aspect 2>

In the piezoelectric actuator according to the aspect 1, the first lower electrode and the second lower electrode are electrically independent.

<Aspect 3>

In the piezoelectric actuator according to the aspect 1 or 2, in a cross section along a direction perpendicular to the planar direction of the substrate, the upper electrode is formed so as to cover an upper face and a side face of the piezoelectric body inside the opening.

<Aspect 4>

In the piezoelectric actuator according to any one of the aspects 1 through 3, the second lower electrode is formed across an area from inside to outside of the piezoelectric body, and contacts the upper electrode at an outside of the piezoelectric body.

<Aspect 5>

In the piezoelectric actuator according to any one of the aspects 1 through 4, a protective film is formed between the upper electrode and top and side faces of the piezoelectric body and between the upper electrode and the second lower electrode.

<Aspect 6>

In the piezoelectric actuator according to any one of the aspects 1 through 5, a distance between the first lower electrode and the second lower electrode is larger than a distance between the first lower electrode and the upper electrode in a direction perpendicular to the planar direction of the substrate.

<Aspect 7>

In the piezoelectric actuator according to any one of the aspects 1 through 6, the second lower electrode has an end portion that is positioned outside relative to the piezoelectric body in the one direction, and the end portion of the second lower electrode is positioned between an end portion of the piezoelectric body and an end portion of the opening.

<Aspect 8>

In the piezoelectric actuator according to any one of the aspects 1 through 7, the second lower electrode has a portion that is positioned outside relative to the piezoelectric body, and the portion of the second lower electrode has a thickness that becomes gradually smaller as closer to an end portion.

<Aspect 9>

In the piezoelectric actuator according to any one of the aspects 1 through 8, the first lower electrode, the second lower electrode, and the upper electrode are formed of a same material, and include at least platinum (Pt) or iridium (Ir).

<Aspect 10>

In the piezoelectric actuator according to any one of the aspects 1 through 9, the substrate includes multiple openings including the opening. The multiple openings is arrayed in the one direction.

<Aspect 11>

A liquid discharge head includes the piezoelectric actuator according to any one of the aspects 1 through 10, and a nozzle member. The nozzle member is bonded to the substrate on a side opposite the diaphragm of the substrate, and includes a nozzle corresponding the opening. Liquid retained in the opening is discharged from the nozzle.

<Aspect 12>

A liquid discharge apparatus includes the liquid discharge head according to the aspect 11, and a driver that drives the piezoelectric element of the piezoelectric actuator. The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

The invention claimed is:

1. A piezoelectric actuator comprising:
a substrate having an opening;
a diaphragm:
   having a first face on one face of the substrate; and
   facing the opening; and
a piezoelectric element including:
   a lower electrode;
   a piezoelectric body; and
   an upper electrode, and
   the lower electrode, the piezoelectric body, and the upper electrode being sequentially laminated on a second face opposite to the first face of the diaphragm in a lamination direction,
wherein the lower electrode includes:
a first lower electrode extending in a first direction; and
multiple second lower electrodes:
   each extending in the first direction;
   disposed on each of both sides of the first lower electrode in a second direction orthogonal to the first direction; and
   separated from the first lower electrode in the second direction,
the piezoelectric body is interior of both ends of the opening in the second direction, and
the first lower electrode is interior of both ends of the piezoelectric body in the second direction.

2. The piezoelectric actuator according to claim 1, wherein the first lower electrode and each of the multiple second lower electrodes are electrically independent.

3. The piezoelectric actuator according to claim 1, wherein the upper electrode covers an upper face and a side face of the piezoelectric body.

4. The piezoelectric actuator according to claim 1, wherein each of the multiple second lower electrodes is across one end of the piezoelectric body in the second direction, and each of the multiple second lower electrodes contacts the upper electrode at an outside of the piezoelectric body in the second direction.

5. The piezoelectric actuator according to claim 1, further comprising a protective film disposed:
between the upper electrode and each of top face and side faces of the piezoelectric body; and
between the upper electrode and each of the multiple second lower electrodes.

6. The piezoelectric actuator according to claim 1, wherein a distance between the first lower electrode and each of the multiple second lower electrodes is larger than a distance between the first lower electrode and the upper electrode in the lamination direction.

7. The piezoelectric actuator according to claim 1, wherein each of the multiple second lower electrodes has one end disposed:
outside the piezoelectric body in the second direction; and
between one of the both ends of the piezoelectric body and one of the both ends of the opening adjacent to the one of the both ends of the of the piezoelectric body in the second direction.

8. The piezoelectric actuator according to claim 1, wherein a portion of each of the multiple second lower electrodes disposed outside of the piezoelectric body has a thickness decreasing toward an end of each of the multiple second lower electrodes in the second direction.

9. The piezoelectric actuator according to claim 1, wherein the first lower electrode, the multiple second lower electrodes, and the upper electrode are made of a same material including at least one of platinum (Pt) or iridium (Ir).

10. The piezoelectric actuator according to claim 1, wherein the substrate has multiple openings including the opening, and
the multiple openings are arrayed in the second direction.

11. A liquid discharge head comprising:
the piezoelectric actuator according to claim 1; and
a nozzle plate bonded to another face of the substrate opposite to the one face of the substrate,
the nozzle plate having a nozzle facing the opening to discharge a liquid in the opening from the nozzle.

12. A liquid discharge apparatus comprising:
the liquid discharge head according to claim 11; and
a driver to drive the piezoelectric element of the piezoelectric actuator.

* * * * *